US012802596B2

(12) United States Patent
Tanaka

(10) Patent No.: US 12,802,596 B2
(45) Date of Patent: Nov. 17, 2026

(54) DISPLAY SYSTEM

(71) Applicant: Magnolia White Corporation, Tokyo (JP)

(72) Inventor: Hitoshi Tanaka, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 112 days.

(21) Appl. No.: 18/918,666

(22) Filed: Oct. 17, 2024

(65) Prior Publication Data

US 2025/0131861 A1 Apr. 24, 2025

(30) Foreign Application Priority Data

Oct. 18, 2023 (JP) ................................. 2023-179594

(51) Int. Cl.
*G09G 3/00* (2006.01)
*H04N 13/344* (2018.01)
*H10W 90/00* (2026.01)

(52) U.S. Cl.
CPC ........... *G09G 3/003* (2013.01); *H04N 13/344* (2018.05); *H10W 90/00* (2026.01); *G09G 2300/02* (2013.01); *G09G 2300/0404* (2013.01); *G09G 2360/04* (2013.01)

(58) Field of Classification Search
CPC .... G09G 3/001; G09G 3/3607; G09G 3/3614; G09G 2320/0233; G09G 3/003; G09G 2300/02; G09G 2300/0404; G09G 2360/04; H04N 13/344; H10W 90/00
See application file for complete search history.

(56) References Cited

U.S. PATENT DOCUMENTS

| | | | | |
|---|---|---|---|---|
| 2006/0098033 A1* | 5/2006 | Langendijk | ............ | G02B 5/201 345/694 |
| 2019/0079234 A1 | 3/2019 | Takagi et al. | | |
| 2019/0265493 A1 | 8/2019 | Takagi et al. | | |
| 2019/0265494 A1 | 8/2019 | Takagi et al. | | |
| 2019/0266974 A1* | 8/2019 | Chen | .................... | G09G 3/3625 |
| 2024/0160052 A1* | 5/2024 | Murata | ............... | G02F 1/13471 |

FOREIGN PATENT DOCUMENTS

| | | |
|---|---|---|
| JP | 2019-053152 A | 4/2019 |
| JP | 2019-148626 A | 9/2019 |
| JP | 2019-148627 A | 9/2019 |

* cited by examiner

*Primary Examiner* — Nelson M Rosario
(74) *Attorney, Agent, or Firm* — K&L Gates LLP

(57) ABSTRACT

According to an aspect, a display system includes: a wearable part; a first display device having a first display region; a second display device having a second display region; and a drive circuit. The first display region and the second display region are provided with sub-pixels arrayed along a first direction and a second direction. The sub-pixels include first sub-pixels, second sub-pixels, and third sub-pixels. The first sub-pixels are continuously arrayed in a third direction inclined with respect to the first and second directions, the second sub-pixels are continuously arrayed in the third direction, and the third sub-pixels are continuously arrayed in the third direction. A first angle between a fifth direction and the third direction is smaller than a second angle between the second direction and the third direction. The fifth direction is orthogonal to a fourth direction in which the first and second display regions are arranged.

5 Claims, 12 Drawing Sheets

DISPLAY SYSTEM

CROSS-REFERENCE TO RELATED APPLICATION

This application claims the benefit of priority from Japanese Patent Application No. 2023-179594 filed on Oct. 18, 2023, the entire contents of which are incorporated herein by reference.

BACKGROUND

1. Technical Field

What is disclosed herein relates to a display system.

2. Description of the Related Art

Japanese Patent Application Laid-open Publication No. 2019-53152, No. 2019-148626, and No. 2019-148627 disclose virtual image display devices used in display systems, such as head mount displays (hereinafter, which may be referred to as HMDs).

HMDs include a display panel that displays images. If the display panel is a transmissive liquid crystal display, the display region of the display panel that displays images is provided with an array of sub-pixels including color filters. In HMDs, the array of sub-pixels may be a mosaic array that produces higher-definition images than a stripe array does.

In HMDs, the display region of the display panel that displays images is positioned in front of user's eyes. Therefore, the distance between the user's eyes and the display region is relatively short. This may possibly cause a phenomenon in which the user visually recognizes the array of sub-pixels as a mesh or stripe pattern (what is called the screen-door effect). It is desirable for display systems, such as HMDs, to reduce the screen-door effect.

For the foregoing reasons, there is a need for a display system that employs a mosaic array as the array of sub-pixels and reduces the screen-door effect.

SUMMARY

According to an aspect, a display system includes: a wearable part capable of being worn on a head of a user in a manner covering both eyes of the user; a first display device provided to the wearable part and having a first display region facing one of the eyes of the user; a second display device provided to the wearable part and having a second display region facing the other of the eyes of the user; and a drive circuit configured to display an image in each of the first display region and the second display region. The first display region and the second display region are provided with a plurality of sub-pixels arrayed in a matrix having row-column configuration along a first direction and a second direction orthogonal to each other in plan view. The sub-pixels include a plurality of first sub-pixels, a plurality of second sub-pixels, and a plurality of third sub-pixels that have different colors. In the first display region, the first sub-pixels, the second sub-pixels, and the third sub-pixels are disposed such that: the first sub-pixel, the second sub-pixel, and the third sub-pixel are repeatedly arrayed along the first direction in the order as listed; and the first sub-pixel, the second sub-pixel, and the third sub-pixel are repeatedly arrayed along the second direction in the order as listed. The first sub-pixels are continuously arrayed in a third direction inclined with respect to the first direction and the second direction, the second sub-pixels are continuously arrayed in the third direction, and the third sub-pixels are continuously arrayed in the third direction. A first angle between a fifth direction and the third direction is smaller than a second angle between the second direction and the third direction in plan view. The fifth direction is orthogonal to a fourth direction in which the first display region and the second display region are arranged.

According to an aspect, a display system includes: a first display device having a first display region facing one of eyes of a user; a second display device having a second display region facing the other of the eyes of the user; and a drive circuit configured to display an image in each of the first display region and the second display region. The first display region and the second display region are provided with a plurality of sub-pixels arrayed in a matrix having row-column configuration along a first direction and a second direction orthogonal to each other in plan view. The sub-pixels include a plurality of first sub-pixels, a plurality of second sub-pixels, and a plurality of third sub-pixels that have different colors. In the first display region, the first sub-pixels, the second sub-pixels, and the third sub-pixels are disposed such that: the first sub-pixel, the second sub-pixel, and the third sub-pixel are repeatedly arrayed along the first direction in the order as listed; and the first sub-pixel, the second sub-pixel, and the third sub-pixel are repeatedly arrayed along the second direction in the order as listed. In the second display region, the first sub-pixels, the second sub-pixels, and the third sub-pixels are disposed such that: the first sub-pixel, the second sub-pixel, and the third sub-pixel are repeatedly arrayed along the first direction in the order as listed; and the first sub-pixel, the third sub-pixel, and the second sub-pixel are repeatedly arrayed along the second direction in the order as listed.

DETAILED DESCRIPTION

Figure 1:
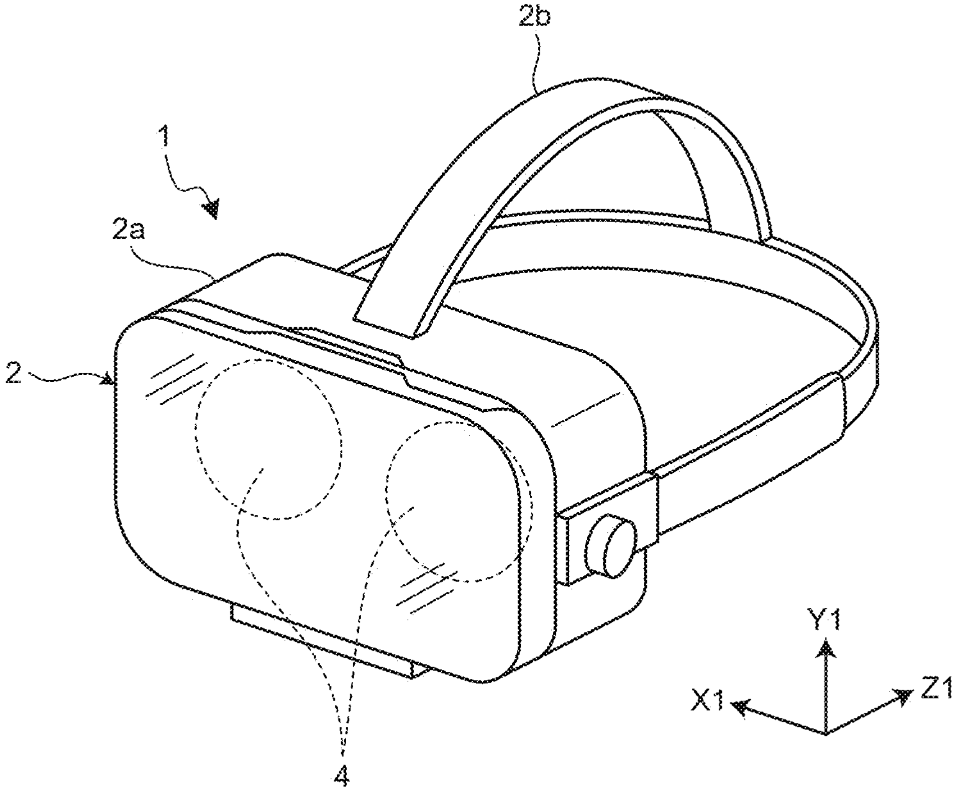
FIG. 1 is a perspective view of a display system according to an embodiment of the present disclosure.

An exemplary embodiment of the present disclosure is described below with reference to the accompanying drawings. The content described in the embodiment below is not intended to limit the present disclosure. Components described below include components easily conceivable by those skilled in the art and components substantially identical therewith. Furthermore, the components described below may be appropriately combined.

What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by the same reference numerals, and detailed explanation thereof may be appropriately omitted.

Figure 2:
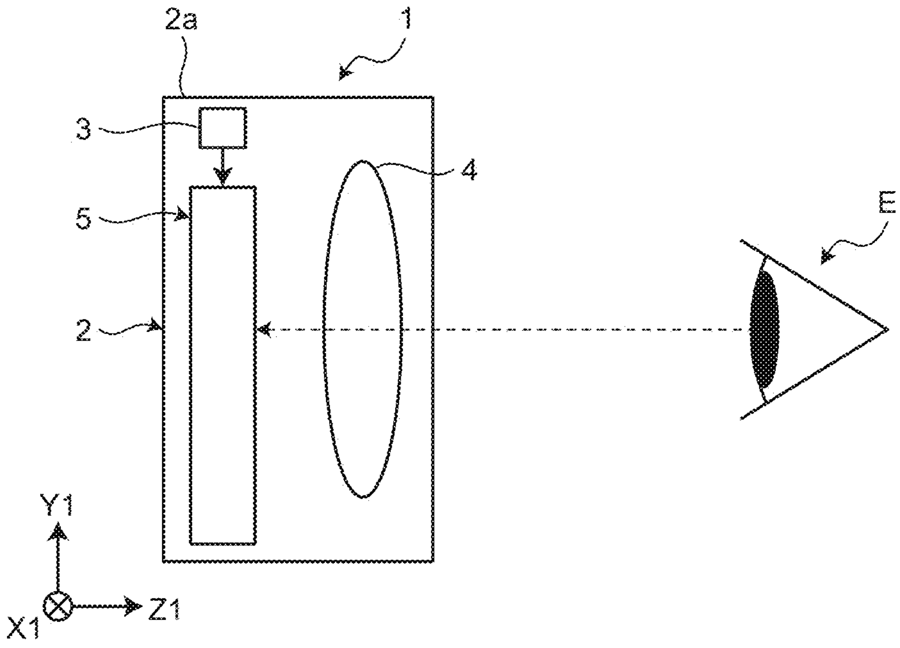
FIG. 2 is a schematic diagram of the configuration of the display system.

FIG. 1 is a perspective view of a display system 1 according to an embodiment of the present disclosure. FIG. 2 is a schematic diagram of the configuration of the display system 1. The display system 1 is, for example, a head mount display. The display system 1 displays images, such as computer graphic video images and 360-degree real video images.

The display system 1 includes a wearable part 2, a video signal source 3, two lenses 4, and a display device 5.

X1-, Y1-, and Z1-directions illustrated in the drawings are orthogonal to each other and indicate the directions of a body 2*a* of the wearable part 2. The X1-, Y1-, and Z1-directions correspond to the width, height, and thickness directions of the body 2*a*. The X1-, Y1-, and Z1-directions are given by way of example only and are not intended to limit the present disclosure. In this specification, each arrow indicates a direction in the drawings, and the side to which the arrow points is a + side of the direction, and the side opposite to the side to which the arrow points is a − side.

Examples of the wearable part 2 include, but are not limited to, a headset, goggles, a helmet, a mask, etc. The wearable part 2 includes the body 2*a* and a belt 2*b*. The body 2*a* is provided with the video signal source 3, the two lenses 4, and the display device 5. The belt 2*b* is wound around a user's head to fix the body 2*a* to the user's head. The wearable part 2 is worn on the user's head such that the body 2*a* covers both eyes of the user.

The video signal source 3 outputs image signals including information on an image to the display device 5. The image signal includes two different images using the parallax of both eyes of the user. The two images are an image for the user's right eye and an image for the user's left eye. The video signal source 3 outputs images stored therein in advance to the display device 5. The video signal source 3 includes, for example, a hard disk drive (HDD) and a flash memory. The video signal source 3 may be provided outside the wearable part 2. In this case, the video signal source 3 is a computer (e.g., server) electrically coupled to the display device 5 in a wired or wireless manner.

The two lenses 4 are disposed at the positions facing user's eyes E. The lens 4 is a convex lens made of glass, for example. The two lenses 4 correspond to the eyes of the user. The lenses 4 are disposed between the display device 5 and the user's eyes E. Due to the lens effects of the lens 4, light output from the display device 5 is condensed to the user's eyes E. The user visually recognizes an image obtained by enlarging the image being displayed on the display device 5.

The display device 5 is disposed opposite the user's eyes E with the two lenses 4 interposed therebetween.

Figure 3:
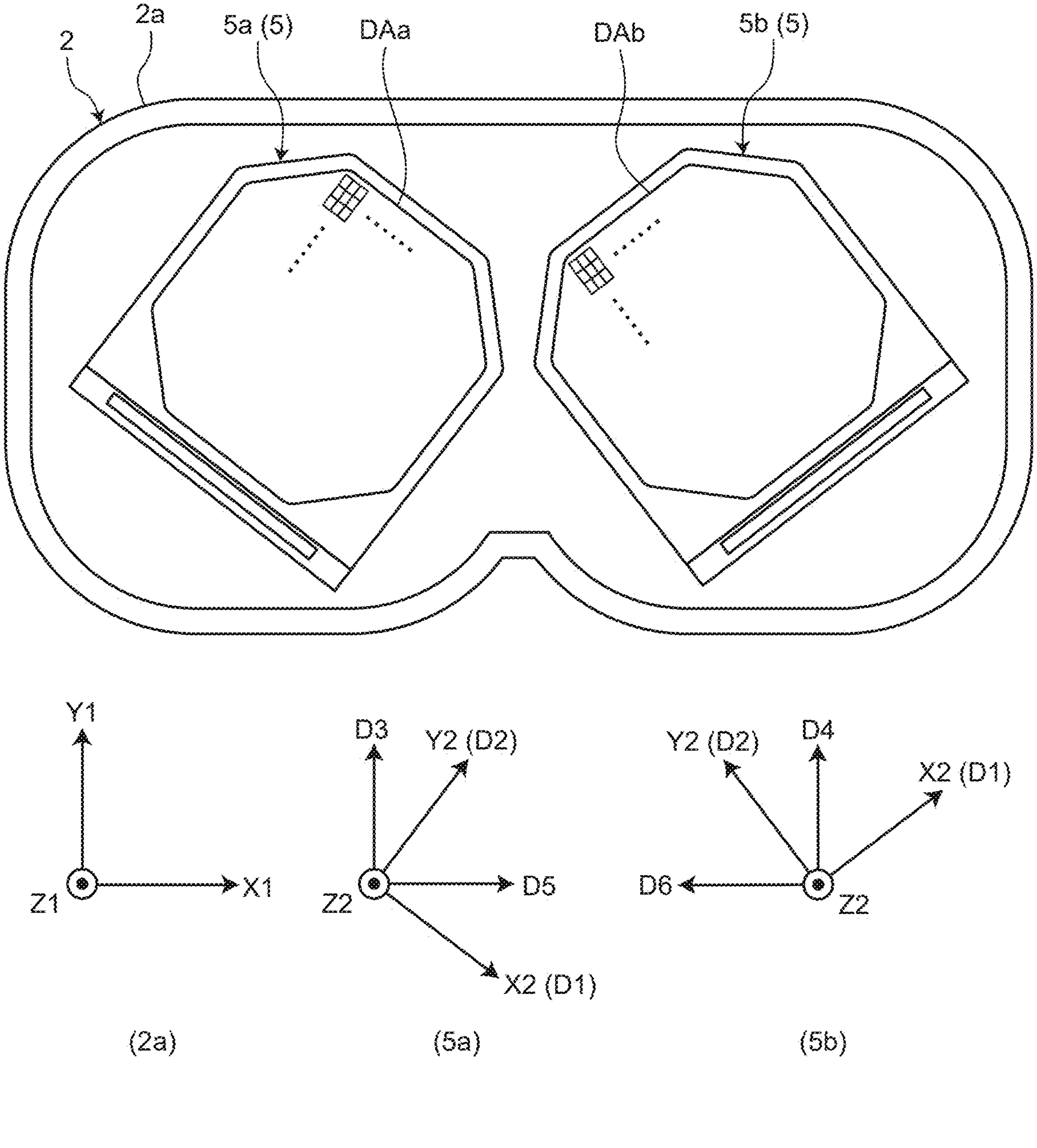
FIG. 3 is a schematic diagram of an arrangement of display devices in a wearable part.

FIG. 3 is a schematic diagram of an arrangement of the display devices 5 in the wearable part 2. The display system 1 includes two display devices 5. In other words, the display system 1 includes a first display device 5*a* and a second display device 5*b*.

The first display device 5*a* acquires an image for the left eye from the video signal source 3. A first display region DAa of the first display device 5*a* faces the user's left eye and displays the image for the left eye. The second display device 5*b* acquires an image for the right eye from the video signal source 3. A second display region DAb of the second display device 5*b* faces the user's right eye and displays the image for the right eye. The first display region DAa and the second display region DAb have a planar shape and are positioned on the same plane orthogonal to the Z1-direction.

With the first display device 5*a* and the second display device 5*b* disposed in this manner, the direction in which the first display region DAa and the second display region DAb are arranged side by side corresponds to the left-to-right direction of the user's eyes. The direction in which the first display region DAa and the second display region DAb are arranged side by side corresponds to the left-to-right direction of the body 2*a*, that is, the X1-direction.

In FIG. 3, the arrows are illustrated that indicate the directions of the first display device 5*a* and the second display device 5*b* (which will be described later in detail). In the following description, the first display device 5*a* and the second display device 5*b* are referred to simply as the "display device 5" when they are not distinguished from each other.

Figure 4:
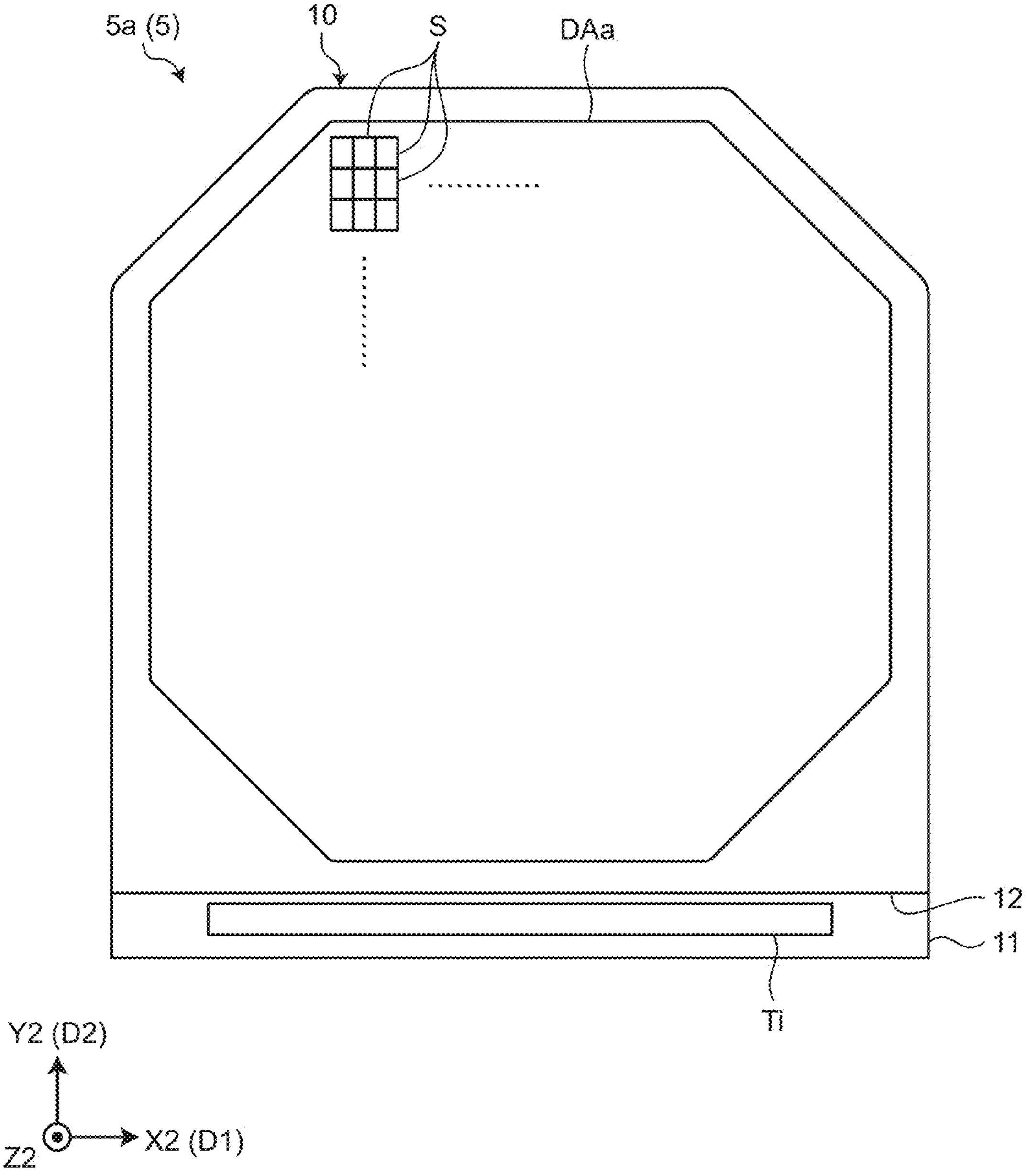
FIG. 4 is a schematic diagram of the configuration of a first display device.
Figure 5:
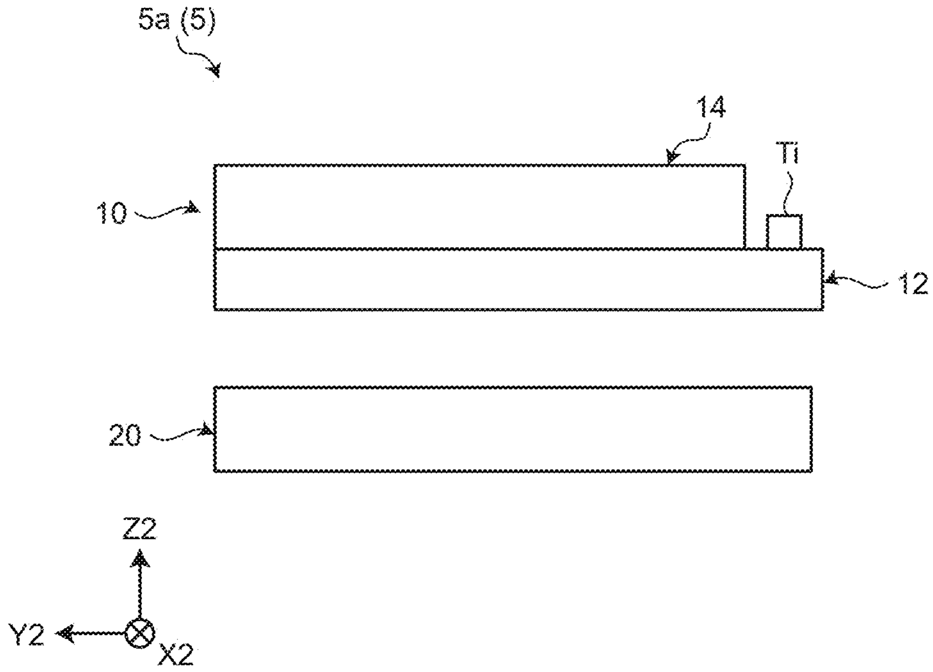
FIG. 5 is a side view of the first display device.

FIG. 4 is a schematic diagram of the configuration of the first display device 5*a*. FIG. 5 is a side view of the first display device 5*a*.

In the following description, X2-, Y2-, and Z2-directions illustrated in the drawings are orthogonal to each other and indicate the directions of the first display device 5*a*. The X2- and Y2-directions correspond to the directions parallel to the principal surface of a substrate included in the first display device 5*a*. The Z2-direction corresponds to the direction orthogonal to the principal surface of the substrate included in the first display device 5*a*. The Z2-direction corresponds to the thickness direction of the first display device 5*a*. The side (+ side) to which the arrow in the Z2-direction points corresponds to the front surface side where images are displayed in the first display device 5*a*, and the side (− side) opposite thereto corresponds to the back surface side of the first display device 5*a*. Viewing the display device 5 along the Z2-direction is referred to as "plan view". The X2-, Y2-, and Z2-directions are given by way of example only and are not intended to limit the present disclosure.

The first display device 5*a* includes a display panel 10 and a lighting device 20.

The display panel 10 is a transmissive liquid crystal display. The display panel 10 may be an organic EL display or a display made of inorganic luminescent material, for example.

The front surface of the display panel 10 has the first display region DAa in which images are displayed. The front surface of the display panel 10 is orthogonal to the Z2-direction. While the first display region DAa has a polygonal shape in plan view, it may have a rectangular shape.

A plurality of sub-pixels S are arrayed in the first display region DAa. The sub-pixels S are arrayed in a matrix (row-column configuration) along a first array direction D1 and a second array direction D2 in plan view. The first array direction D1 and the second array direction D2 are orthogonal to each other. The first array direction D1 is parallel to the X2-direction. The second array direction D2 is parallel to the Y2-direction. The first array direction D1 may be inclined with respect to the X2-direction. The sub-pixel S will be described later in greater detail.

The lighting device 20 is disposed on the back surface side of the display panel 10 and outputs light toward the display panel 10. The lighting device 20 is what is called a direct backlight. The lighting device 20 includes a plurality of light-emitting diodes, for example.

Figure 6:
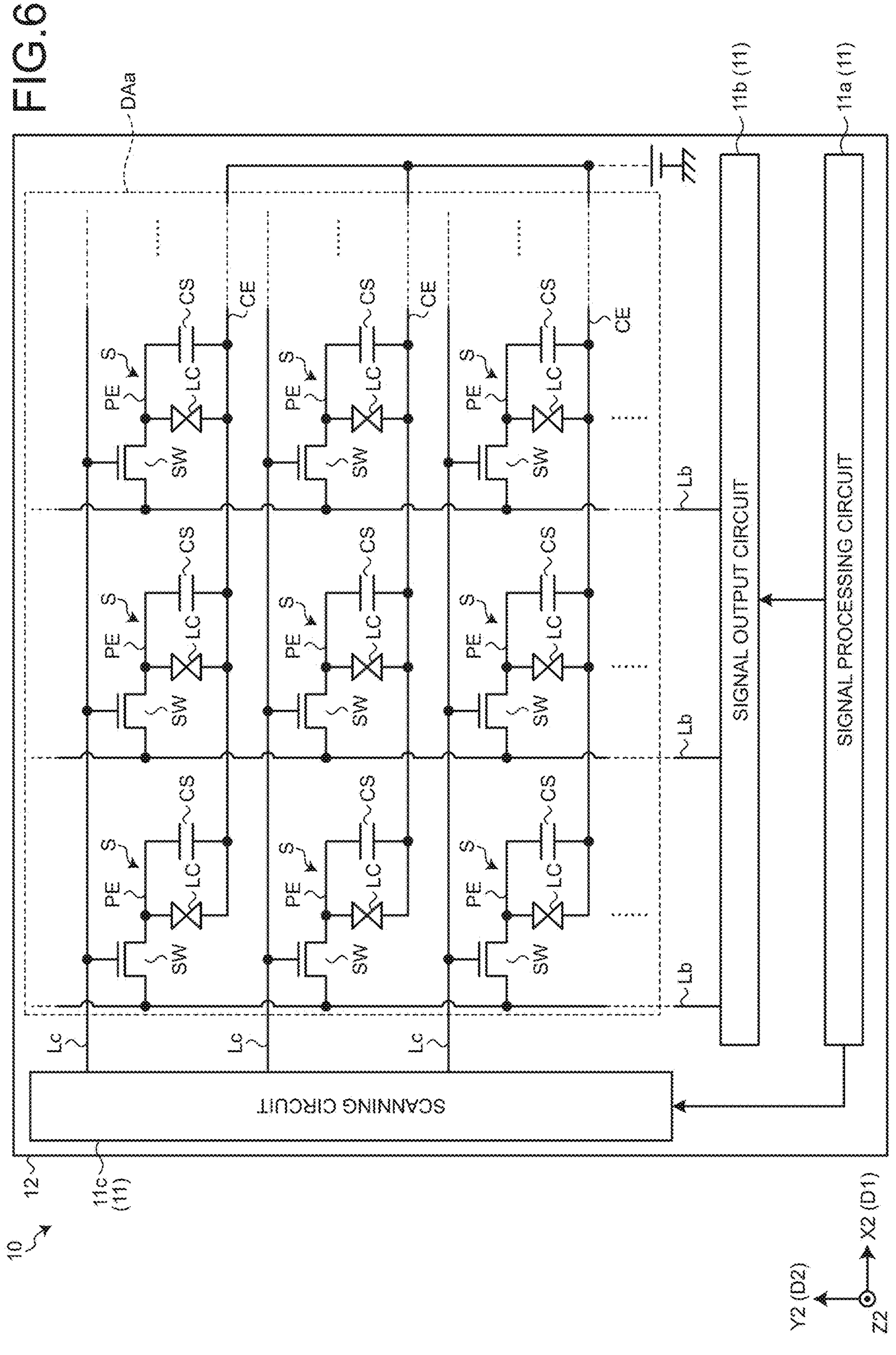
FIG. 6 is a diagram of a circuit configuration of a display panel.

FIG. 6 is a diagram of a circuit configuration of the display panel 10. The display panel 10 includes a drive circuit 11, and a switching element SW, a sub-pixel electrode PE, a common electrode CE, liquid crystal capacitor LC, and holding capacitor CS that are included in each of the sub-pixels S.

The drive circuit 11 displays images in the first display region DAa. The drive circuit 11 includes a signal processing circuit 11*a*, a signal output circuit 11*b*, and a scanning circuit 11*c*.

The signal processing circuit 11*a* generates a plurality of sub-pixel signals, which will be described later, based on the image signals transmitted from the video signal source 3 and outputs the generated sub-pixel signals to the signal output circuit 11*b*. The signal processing circuit 11*a* outputs clock signals for synchronizing the operation of the signal output circuit 11*b* with the operation of the scanning circuit 11*c* to the signal output circuit 11*b* and the scanning circuit 11*c*.

The signal output circuit 11*b* outputs the sub-pixel signals to the respective sub-pixels S. The signal output circuit 11*b* and the sub-pixels S are electrically coupled via a plurality of signal lines Lb extending along the second array direction D2.

The scanning circuit 11*c* scans a plurality of sub-pixels S in synchronization with the output of the sub-pixel signals by the signal output circuit 11*b*. The scanning circuit 11*c* and the sub-pixels S are electrically coupled via a plurality of scanning lines Lc extending along the first array direction D1.

The area partitioned by two signal lines Lb adjacent to each other in the first array direction D1 and two scanning lines Lc adjacent to each other in the second array direction D2 in plan view corresponds to one sub-pixel S.

The switching element SW is composed of a thin-film transistor (TFT), for example. In the switching element SW, the source electrode is electrically coupled to the signal line Lb, and the gate electrode is electrically coupled to the scanning line Lc.

The sub-pixel electrode PE is coupled to the drain electrode of the switching element SW. A plurality of common electrodes CE are disposed corresponding to the scanning lines Lc. The sub-pixel electrode PE and the common electrode CE have a light-transmitting property.

The liquid crystal capacitor LC is a capacitance component of the liquid crystal material of a liquid crystal layer 13, which will be described later, between the sub-pixel electrode PE and the common electrode CE. The holding capacitor CS is provided between the electrode with the same potential as that of the common electrode CE and the electrode with the same potential as that of the sub-pixel electrode PE.

Figure 7:
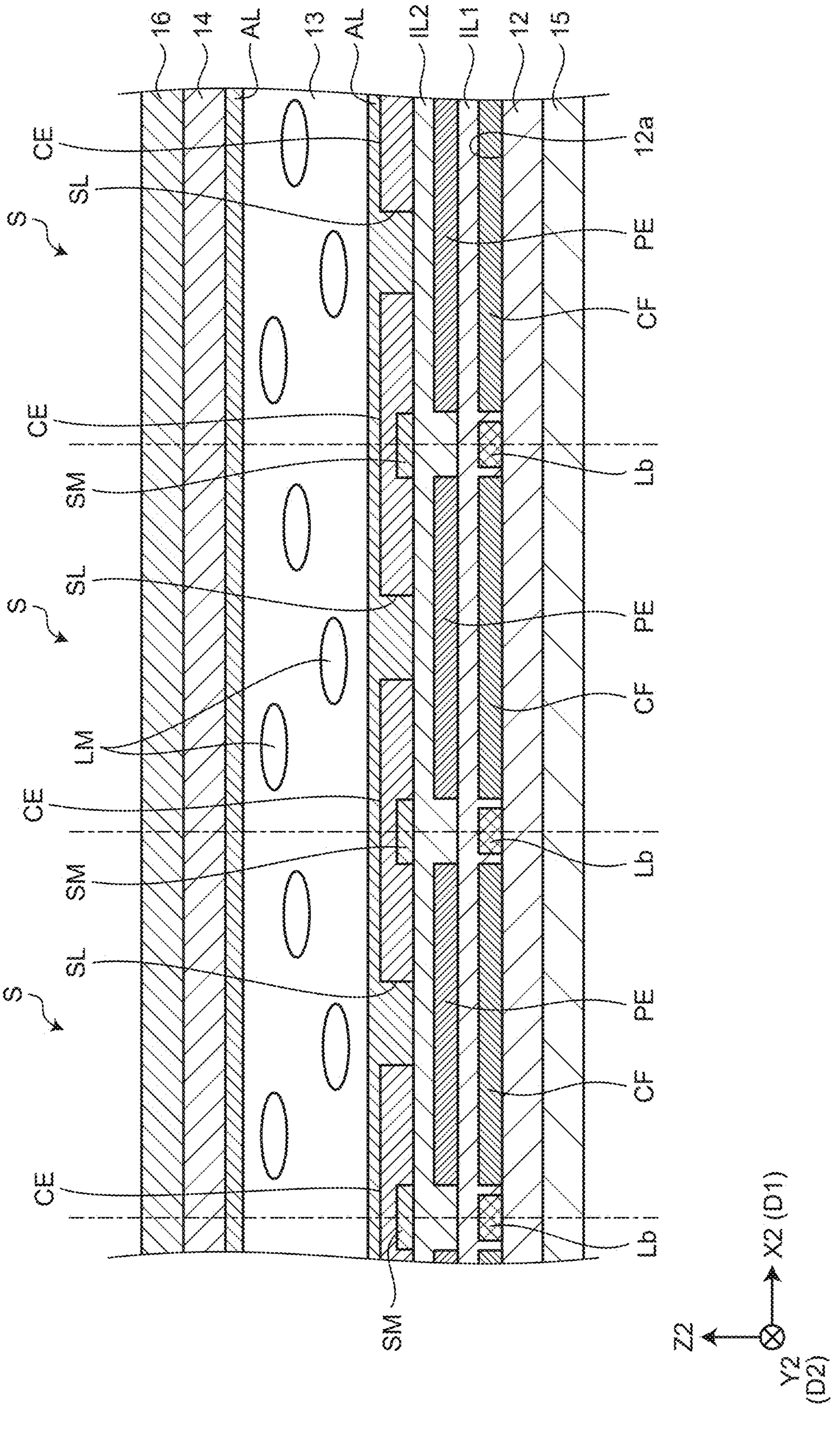
FIG. 7 is a sectional view of the display panel.

FIG. 7 is a sectional view of the display panel 10. The display panel 10 includes a first substrate 12, a liquid crystal layer 13, and a second substrate 14.

The first substrate 12, the liquid crystal layer 13, and the second substrate 14 have a light-transmitting property and are disposed in this order along the Z2-direction from the – side to the + side in the Z2-direction. The first substrate 12 is provided with an IC chip T1 constituting the drive circuit 11 (refer to FIGS. 4 and 5).

A principal surface 12*a* corresponding to the front surface of the first substrate 12 is provided with the signal lines Lb and the scanning lines Lc (not illustrated in FIG. 7). The principal surface 12*a* of the first substrate 12 is also provided with color filters CF. The color filters CF each have a rectangular shape in plan view and are disposed corresponding to the sub-pixels S.

The color filter CF has a light-transmitting property, and the peak of the spectrum of light to be transmitted through the color filter CF is determined in advance. The peak of the spectrum is one of the peaks of three spectra corresponding to three different colors. While the three colors are red, green, and blue, it is needless to say that the number and type of colors are not limited thereto. In the following description, the color corresponding to the peak of the spectrum of light transmitted by the color filter CF is referred to as the color of the color filter CF. The color of the color filter CF corresponds to that of the sub-pixel S.

The first substrate 12 is also provided with the sub-pixel electrodes PE on the + side in the Z2-direction of the color filters CF and the signal lines Lb with an insulating layer IL1 interposed therebetween. The sub-pixel electrode PE overlaps the color filter CF when viewed in the Z2-direction.

The first substrate 12 is also provided with a light-shielding film SM, the common electrodes CE, and an orientation film AL on the + side in the Z2-direction of the sub-pixel electrodes PE with an insulating layer IL2 interposed therebetween.

The light-shielding film SM has a light-shielding property. The light-shielding film SM overlaps the signal lines Lb and the scanning lines Lc when viewed in the Z2-direction. Specifically, the light-shielding film SM separates the sub-pixels S from each other. In other words, the light-shielding film SM overlaps when viewed in the Z2-direction with the boundaries of two sub-pixels S adjacent to each other in the first array direction D1 and two sub-pixels S adjacent to each other in the second array direction D2.

The common electrode CE is stacked on the light-shielding film SM, has slits SL, and is disposed over two sub-pixel electrodes PE adjacent to each other in plan view. Thus, the common electrode CE and the sub-pixel electrodes PE are disposed in the first substrate 12. In other words, the display panel 10 is a lateral electric field liquid crystal display.

The liquid crystal layer 13 includes a plurality of liquid crystal molecules LM. The liquid crystal layer 13 is provided between two orientation films AL facing each other in the Z2-direction. The orientation of the liquid crystal molecules LM is regulated by the two orientation films AL. An orientation film AL is disposed on the back surface side of the second substrate 14.

The display panel 10 further includes a first polarizing plate 15 disposed on the back surface side of the first substrate 12 and a second polarizing plate 16 disposed on the front surface side of the second substrate 14.

The first polarizing plate 15 has a transmission axis orthogonal to the Z2-direction. The second polarizing plate 16 has a transmission axis orthogonal to the transmission axis of the first polarizing plate 15 and the Z2-direction.

The following describes the operation of the first display device 5*a* to display an image in the first display region DAa. When the first display device 5*a* acquires the image signals transmitted from the video signal source 3, the first display device 5*a* displays an image in the first display region DAa.

The image signals include information on the gradations of the sub-pixels S corresponding to the image. The drive circuit 11 generates sub-pixel signals indicating the gradations of the sub-pixels S and outputs them to the sub-pixels S. As a result, voltages corresponding to the gradations indicated by the sub-pixel signals are applied to the liquid crystal layer 13 corresponding to the sub-pixels S, thereby inclining the liquid crystal molecules LM. The degrees of inclination of the liquid crystal molecules LM vary depending on the gradations indicated by the sub-pixel signals.

Light output from the lighting device 20 is incident into the display panel 10. The light incident into the display panel 10 passes through the color filter CF, thus is colored by the color filter CF, and then enters the liquid crystal layer 13. Due to the inclination of the liquid crystal molecules LM, the light passing through the liquid crystal layer 13 is modulated to the gradations indicated by the sub-pixel signals. The light that has passed through the liquid crystal layer 13 is output from the display panel 10. As a result, an image is displayed in the first display region DAa.

Next, the array of the sub-pixels S in the first display region DAa is described.

Figure 8:
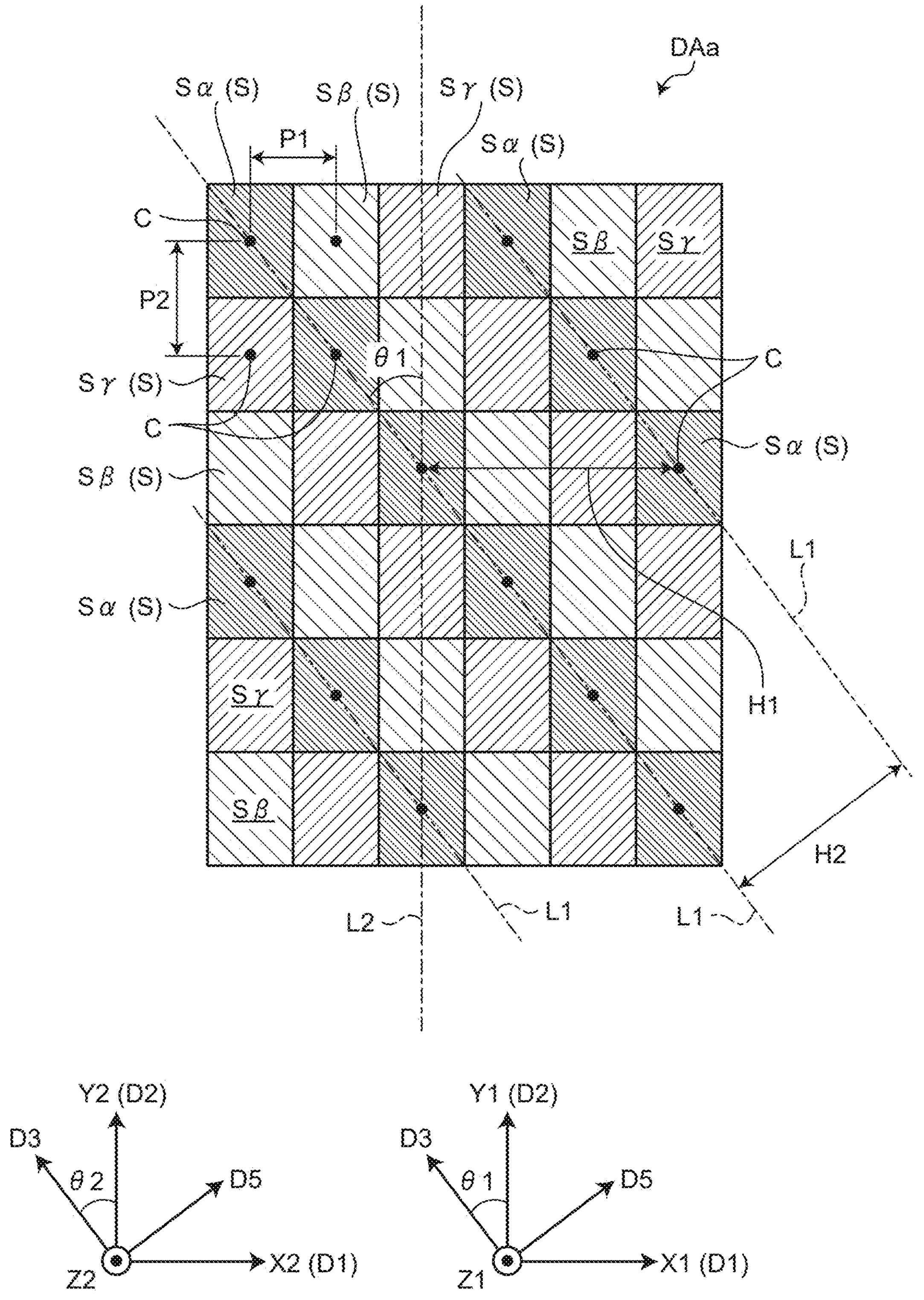
FIG. 8 is a plan view of a first display region illustrating the array of a plurality of sub-pixels in the first display region of the first display device.

FIG. 8 is a plan view of the first display region DAa illustrating the array of the sub-pixels S in the first display region DAa of the first display device 5*a*. The sub-pixels S illustrated in FIG. 8 are some of the sub-pixels S arrayed in the first display region DAa. The sub-pixels S illustrated in FIG. 8 are indicated by the color filters CF and the light-shielding film SM. In plan view, the display region is partitioned into the sub-pixels S by the light-shielding film SM, and the color filter CF has a rectangular shape.

For convenience of explanation, FIG. 8 illustrates the first display region DAa oriented such that the X1-direction and the first array direction D1 illustrated in FIG. 3 are parallel. FIG. 8 also illustrates the X1- and Y1-directions.

The sub-pixels S have the same rectangular shape in plan view. As described above, the sub-pixels S are arrayed in a matrix (row-column configuration) along the first array direction D1 and the second array direction D2 in plan view.

In the following description, a first pitch P1 denotes the distance between center points C of two sub-pixels S adjacent to each other in the first array direction D1 out of the sub-pixels S in plan view, and a second pitch P2 denotes the distance between the center points C of two sub-pixels S adjacent to each other in the second array direction D2 out of the sub-pixels S. The ratio of the second pitch P2 to the first pitch P1 according to the present embodiment is 4/3. The ratio of the second pitch P2 to the first pitch P1 may be 2. The ratio of the second pitch P2 to the first pitch P1 simply needs to be 4/3 or larger and smaller than 3.

The sub-pixels S include a plurality of first sub-pixels Sα, a plurality of second sub-pixels Sβ, and a plurality of third sub-pixels Sγ. The first sub-pixel Sα, the second sub-pixel Sβ, and the third sub-pixel γ have different colors of the color filters CF, that is, different colors of the sub-pixels S. The color of the first sub-pixel Sα is red. The color of the second sub-pixel Sβ is green. The color of the third sub-pixel Sγ is blue. In other words, the first sub-pixel Sα is a red sub-pixel S. The second sub-pixel Sβ is a green sub-pixel S. The third sub-pixel Sγ is a blue sub-pixel S. Needless to say, the colors of the sub-pixels S are not limited thereto.

In the following description, the first sub-pixel Sα, the second sub-pixel Sβ, and the third sub-pixel Sγ may be referred to simply as the "sub-pixel S" when they are not distinguished from one another.

In the first display region DAa, the first sub-pixels Sα, the second sub-pixels Sβ, and the third sub-pixels Sγ are disposed as illustrated in FIG. 8. The array of the sub-pixels S illustrated in FIG. 8 is what is called a mosaic array. Specifically, the first sub-pixel Sα, the second sub-pixel Sβ, and the third sub-pixel Sγ are repeatedly disposed in this order along the first array direction D1 from the − side to the + side in the first array direction D1 in plan view, and the first sub-pixel Sα, the second sub-pixel Sβ, and the third sub-pixel Sγ are repeatedly disposed in this order along the second array direction D2 from the − side to the + side in the second array direction D2.

In the mosaic array illustrated in FIG. 8, the sub-pixels S of the same color are continuously arrayed along a third array direction D3 inclined with respect to the first array direction D1 and the second array direction D2 in plan view. In other words, the first sub-pixels Sα are continuously arrayed along the third array direction D3 in plan view, the second sub-pixels Sβ are continuously arrayed along the third array direction D3 in plan view, and the third sub-pixels Sγ are continuously arrayed along the third array direction D3 in plan view.

In FIG. 8, first imaginary lines L1 and a second imaginary line L2 are illustrated. The first imaginary line L1 is a straight line joining the center points C of the first sub-pixels Sα continuously arrayed along the third array direction D3. The direction in which the first imaginary line L1 extends is parallel to the third array direction D3. The first sub-pixels Sα are continuously arrayed along the first imaginary line L1, the second sub-pixels Sβ are continuously arrayed along the first imaginary line L1, and the third sub-pixels Sγ are continuously arrayed along the first imaginary line L1. A plurality of the first imaginary lines L1 are illustrated in FIG. 8.

The second imaginary line L2 is a straight line passing through the center points C of the first sub-pixels Sα and parallel to the Y1-direction indicating the direction of the body 2*a* of the wearable part 2. One second imaginary line L2 is illustrated in FIG. 8.

In the stripe array, which is one of the array patterns of the sub-pixels S, the first sub-pixel Sα, the second sub-pixel Sβ, and the third sub-pixel Sβ are repeatedly arrayed in this order along the first array direction D1 from the − side to the + side in the first array direction D1, and the sub-pixels S of the same color are continuously arrayed in the second array direction D2. In the stripe array, the ratio of the second pitch P2 to the first pitch P1 is 3. Thus, the ratio is smaller in the mosaic array than in the stripe array. Therefore, the mosaic array can produce a higher-definition image than the stripe array.

Next, the configuration of the second display device 5*b* is described. The second display device 5*b* has the same configuration as that of the first display device 5*a* described above, except for the array of the sub-pixels S. In other words, the shape and size of the second display region DAb of the second display device 5*b* are the same as those of the first display region DAa of the first display device 5*a* in plan view.

Figure 9:
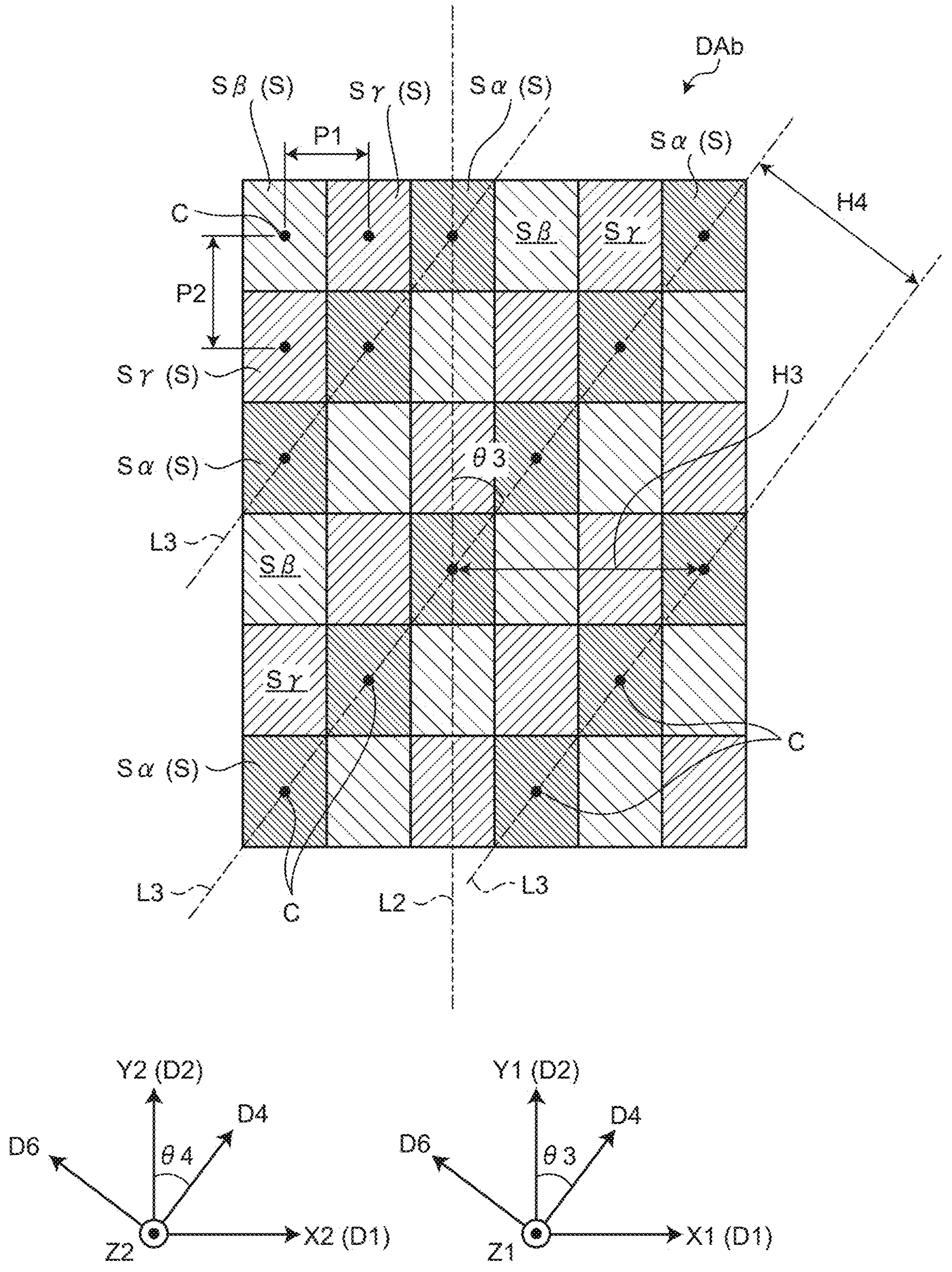
FIG. 9 is a plan view of a second display device illustrating the array of a plurality of sub-pixels in a second display region of the second display device.

FIG. 9 is a plan view of the second display device 5*b* illustrating the array of the sub-pixels S in the second display region DAb of the second display device 5*b*. The sub-pixels S illustrated in FIG. 9 are some of the sub-pixels S arrayed in the second display region DAb. Similarly to the sub-pixels S illustrated in FIG. 8, the sub-pixels S illustrated in FIG. 9 are indicated by the color filters CF and the light-shielding film SM.

For convenience of explanation, FIG. 9 illustrates the second display region DAb oriented such that the X1-direction and the first array direction D1 illustrated in FIG. 3 are parallel. FIG. 9 also illustrates the X1- and Y1-directions.

Similarly to the first display region DAa, the sub-pixels S in the second display region DAb are also arrayed in a matrix (row-column configuration) along the first array direction D1 and the second array direction D2.

In the second display region DAb, the first sub-pixels Sα, the second sub-pixels Sβ, and the third sub-pixels Sγ are disposed as illustrated in FIG. 9. The array of the sub-pixels S illustrated in FIG. 9 is a mosaic array. Specifically, the first sub-pixel Sα, the second sub-pixel Sβ, and the third sub-pixel Sβ are repeatedly disposed in this order along the first array direction D1 from the − side to the + side in the first array direction D1 in plan view, and the first sub-pixel Sα, the third sub-pixel Sγ, and the second sub-pixel Sβ are repeatedly disposed in this order along the second array direction D2 from the − side to the + side in the second array direction D2.

In the mosaic array illustrated in FIG. 9, the sub-pixels S of the same color are continuously arrayed along a fourth array direction D4 inclined with respect to the first array direction D1 and the second array direction D2 in plan view. In other words, the first sub-pixels Sα are continuously arrayed along the fourth array direction D4 in plan view, the second sub-pixels Sβ are continuously arrayed along the fourth array direction D4 in plan view, and the third sub-pixels Sγ are continuously arrayed along the fourth array direction D4 in plan view.

In FIG. 9, the second imaginary line L2 and third imaginary lines L3 are illustrated. The second imaginary line L2 is the second imaginary line L2 illustrated in FIG. 8, which is a straight line passing through the center points C of the first sub-pixels Sα and parallel to the Y1-direction. One second imaginary line L2 is illustrated in FIG. 9.

The third imaginary line L3 is a straight line connecting the center points C of the first sub-pixels Sα continuously arrayed along the fourth array direction D4. In other words, the direction in which the third imaginary line L3 extends is parallel to the fourth array direction D4. The first sub-pixels Sα are continuously arrayed along the third imaginary line L3, the second sub-pixels Sβ are continuously arrayed along the third imaginary line L3, and the third sub-pixels Sγ are continuously arrayed along the third imaginary line L3. A plurality of the third imaginary lines L3 are illustrated in FIG. 9.

The shape and size of the sub-pixel S of the first display device 5*a* are the same as those of the sub-pixel S of the second display device 5*b*. In the first display region DAa and the second display region DAb, the sub-pixels S are arrayed in a matrix (row-column configuration) along the first array direction D1 and the second array direction D2. Therefore, the first imaginary line L1 in FIG. 8 and the third imaginary line L3 in FIG. 9 are line-symmetric with respect to the second imaginary line L2. In other words, the angle between the second array direction D2 and the third array direction D3 illustrated in FIG. 8 (second angle θ2, which will be described later) is equal to the angle between the second array direction D2 and the fourth array direction D4 illustrated in FIG. 9 (fourth angle θ4, which will be described later).

As described above, the distance between the first display region DAa and the second display region DAb, and the user's eyes is relatively short when the wearable part 2 is worn on the user's head in a manner covering both eyes of the user. This may possibly cause a phenomenon in which the user visually recognizes the array of the sub-pixels S as a mesh or stripe pattern (what is called the screen-door effect (hereinafter, which may be referred to as SDE)).

For example, when only red is displayed in the first display region DAa, the luminance of the red first sub-pixel Sα is larger than 0, and the luminance of each of the green second sub-pixel Sβ and the blue third sub-pixel Sγ is 0. Therefore, the first sub-pixel Sα displays red, and the second sub-pixel Sβ and the third sub-pixel Sγ display black. As described above, the first sub-pixels Sα are continuously arrayed along the third array direction D3, the second sub-pixels Sβ are continuously arrayed along the third array direction D3, and the third sub-pixels Sγ in the first display region DAa are continuously arrayed along the third array direction D3. In this case, the SDE may possibly occur in which the user visually recognizes a stripe pattern of alternately arrayed red and black rows each of which extends along the third array direction D3.

Typically, the left-and-right field of view of the human eye is wider than the up-and-down field of view, and the human eyeball can move faster in the left-and-right direction than in the up-and-down direction. Therefore, when the red and black rows are alternately arrayed in the display region as described above, the stripe pattern is more likely to be visually recognized as the interval between the rows of the same color in the left-and-right direction is larger. Conversely, the stripe pattern is less likely to be visually recognized as the interval between the rows of the same color in the left-and-right direction is smaller, whereby occurrence of the SDE can be reduced. The left-and-right direction and the up-and-down direction of the human eye correspond to the X1-direction and the Y1-direction illustrated in FIGS. 3, 8, and 9.

In the first display region DAa illustrated in FIG. 8, the distance in the X1-direction between the two first imaginary lines L1 adjacent to each other is referred to as a first distance H1. As described above, the X1-direction corresponds to the left-and-right direction of the human eye. In other words, the first distance H1 corresponds to the distance between two sub-pixels S of the same color adjacent to each other in the left-and-right direction of the human eye.

In the first display region DAa, the distance between two first imaginary lines L1 adjacent to each other is referred to as a second distance H2. The second distance H2 corresponds to the distance between two sub-pixels S of the same color adjacent to each other in a fifth array direction D5 orthogonal to the third array direction D3.

The sub-pixels S have the same shape and size and are arrayed in the mosaic array described above. Thus, the second distance H2 is shorter than the first distance H1 in FIG. 8. Therefore, when the first display region DAa rotates in such a direction that the state of the first display region DAa changes from a state where the X1-direction and the first array direction D1 are parallel as illustrated in FIG. 8 to a state where the X1-direction and the fifth array direction D5 are parallel, the first imaginary lines L1 rotate, and the first distance H1 becomes smaller. As a result, the distance between two sub-pixels S of the same color adjacent to each other in the left-and-right direction of the human eye becomes smaller. Therefore, occurrence of the SDE can be reduced.

If the first display region DAa is rotated in such a direction that the state of the first display region DAa changes from the state where the X1-direction and the first array direction D1 are parallel as illustrated in FIG. 8 to the state where the X1-direction and the fifth array direction D5 are parallel, the second distance H2 does not change because the first imaginary lines L1 rotate.

The second imaginary line L2 is parallel to the Y1-direction indicating the direction of the body 2*a* of the wearable part 2. If the first display region DAa is rotated, the second imaginary line L2 does not rotate. Therefore, rotating the first display region DAa in such a direction that the state of the first display region DAa changes from the state where the X1-direction and the first array direction D1 are parallel as illustrated in FIG. 8 to the state where the X1-direction and the fifth array direction D5 are parallel, is equivalent to decreasing the first angle θ1 between the Y1-direction (second imaginary line L2) and the third array direction D3 (first imaginary line L1).

In FIG. 8, the second angle θ2 between the second array direction D2 and the third array direction D3 is equal to the first angle θ1. When the first display region DAa rotates, around the Z2-direction, in the direction that reduces the first angle θ1 (the first display region DAa rotates in the clockwise direction in FIG. 8), the first array direction D1, the second array direction D2, the third array direction D3, and the fifth array direction D5 also rotate, and the second angle θ2 between the second array direction D2 and the third array direction D3 does not change.

In other words, rotating the first display region DAa, around the Z2-direction, in the direction that reduces the first angle θ1 (rotating the first display region DAa in the clockwise direction in FIG. 8) is equivalent to making the first angle θ1 smaller than the second angle θ2. Therefore, the first display device 5*a* is placed in the wearable part 2 with the first display region DAa oriented such that the first angle θ1 is smaller than the second angle θ2, whereby occurrence of the SDE can be reduced.

Figure 10:
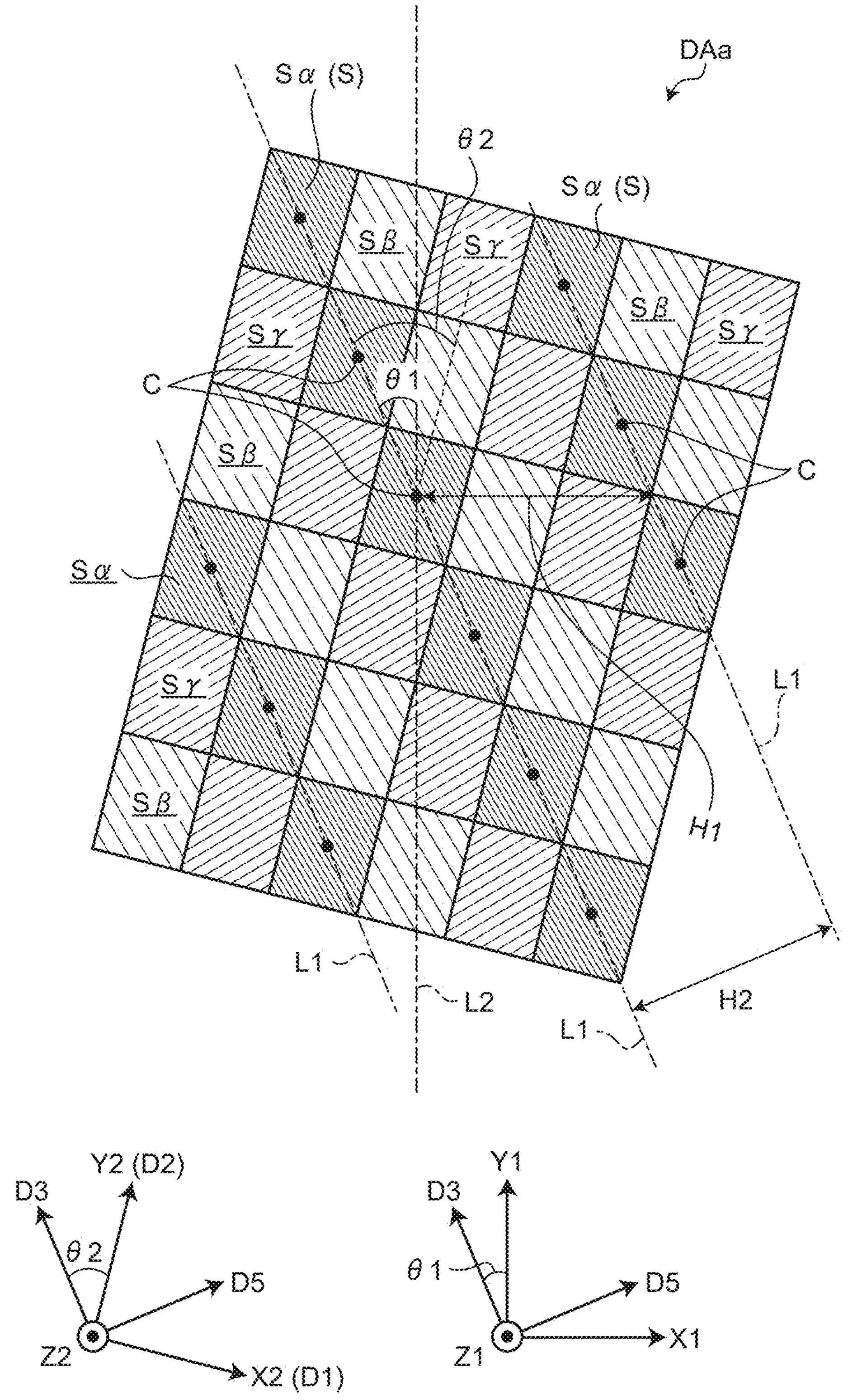
FIG. 10 is a diagram of the first display region illustrated in FIG. 8 rotated in the clockwise direction in FIG. 8 around a Z2-direction.

FIG. 10 is a view of the first display region DAa illustrated in FIG. 8 rotated in the clockwise direction in FIG. 8 around the Z2-direction.

In the first display region DAa illustrated in FIG. 10, the second imaginary line L2 overlaps only three first sub-pixels Sα out of the first sub-pixels Sα continuously arrayed along the first imaginary line L1 (third array direction D3). The first angle θ1 in FIG. 10 is the largest angle within the range where the second imaginary line L2 overlaps only the three first sub-pixels Sα. The dashed line indicating the second angle θillustrated in FIG. 10 is parallel to the Y2-direction. In FIG. 10, the first angle θ1 is smaller than the second angle θ2.

The first distance H1 in FIG. 10 is smaller than the first distance H1 in FIG. 8. Therefore, occurrence of the SDE can be reduced in the mosaic array described above.

Figure 11:
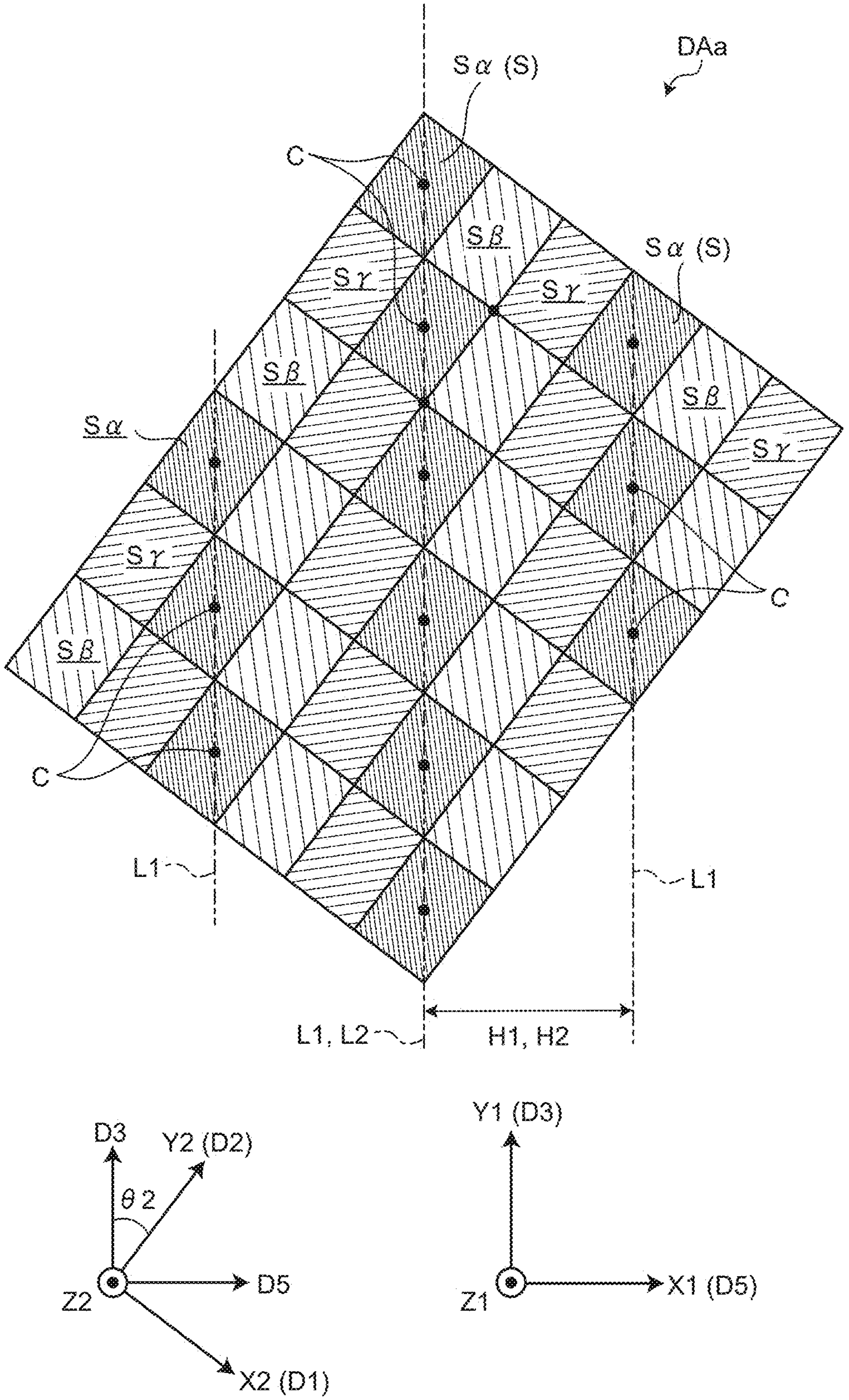
FIG. 11 is a diagram of the first display region illustrated in FIG. 10 rotated in the clockwise direction in FIG. 10 around the Z2-direction.

FIG. 11 is a view of the first display region DAa illustrated in FIG. 10 rotated in the clockwise direction in FIG. 10 around the Z2-direction.

In the first display region DAa illustrated in FIG. 11, the second imaginary line L2 is parallel to the third array direction D3. In the first display region DAa illustrated in FIG. 11, the fifth array direction D5 is parallel to the X1-direction (left-and-right direction of the human eye). Therefore, the first imaginary line L1 overlaps the second imaginary line L2. In FIG. 11, the first angle θ1 (not illustrated in FIG. 11) is 0 and smaller than the second angle θ2.

The first distance H1 in FIG. 11 is equal to the second distance H2 and smaller than the first distance H1 in FIG. 8. Therefore, occurrence of the SDE can be reduced in the mosaic array described above.

Figure 12:
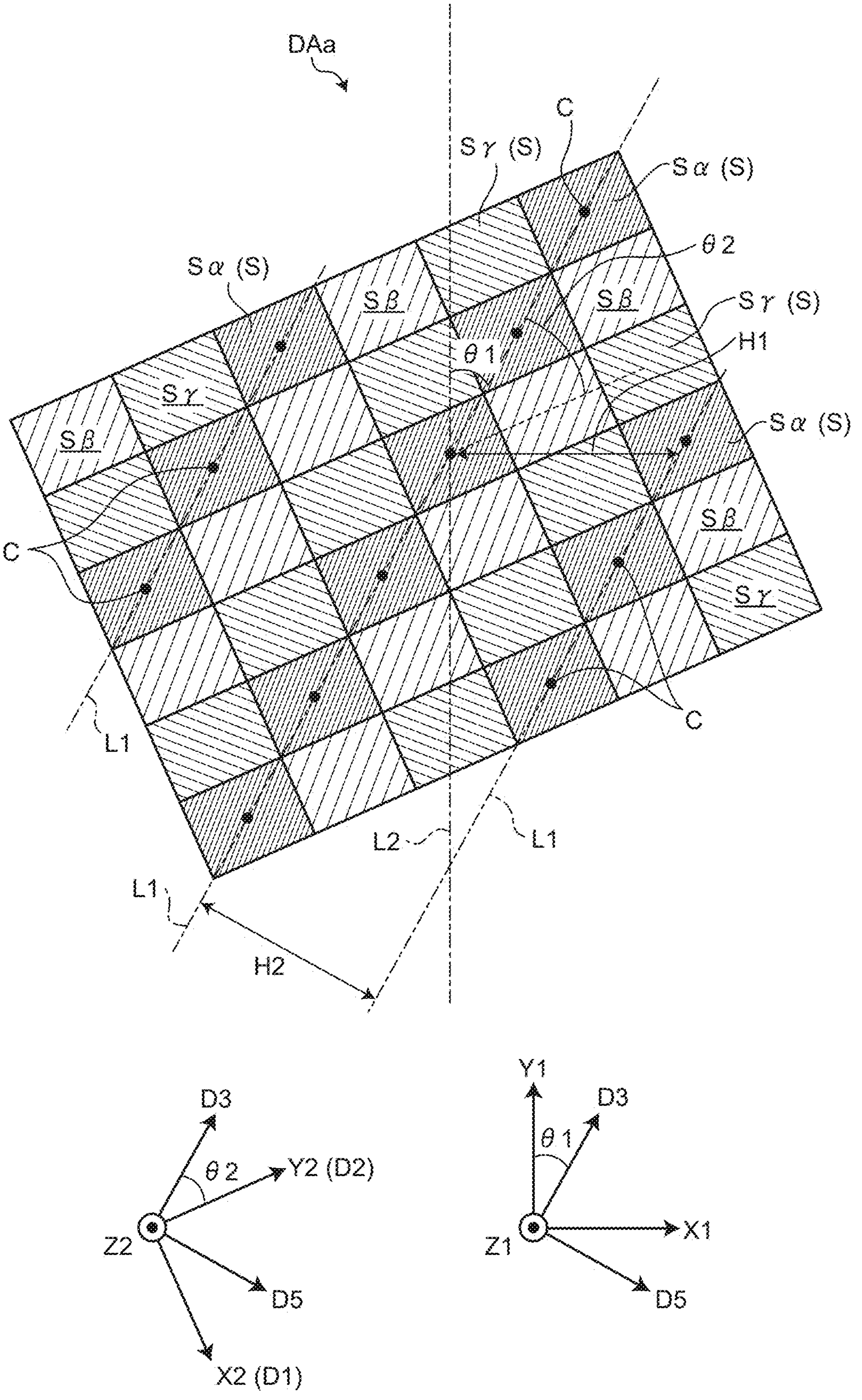
FIG. 12 is a diagram of the first display region illustrated in FIG. 11 rotated in the clockwise direction in FIG. 11 around the Z2-direction.

FIG. 12 is a view of the first display region DAa illustrated in FIG. 11 rotated in the clockwise direction in FIG. 11 around the Z2-direction.

In the first display region DAa illustrated in FIG. 12, the second imaginary line L2 overlaps only three first sub-pixels Sα out of the first sub-pixels Sα continuously arrayed along the first imaginary line L1 (third array direction D3). The first angle θ1 in FIG. 12 is the largest angle within the range where the second imaginary line L2 overlaps only the three first sub-pixels Sα. The dashed line indicating the second angle θ2 illustrated in FIG. 12 is parallel to the Y2-direction. In FIG. 12, the first angle θ1 is smaller than the second angle θ2.

The first distance H1 in FIG. 12 is smaller than the first distance H1 in FIG. 8. Therefore, occurrence of the SDE can be reduced in the mosaic array described above.

When the first display region DAa rotates in the range from the rotational position of the first display region DAa illustrated in FIG. 10 to the rotational position of the first display region DAa illustrated in FIG. 12, the second imaginary line L2 overlaps at least three first sub-pixels Sα out of the first sub-pixels Sα continuously arrayed along the third array direction D3 in plan view. In other words, the first angle θ1 is defined as the angle at which at least three sub-pixels S out of the sub-pixels S continuously arrayed along the third array direction D3 overlap the second imaginary line L2. In this case, the first angle θ1 is certainly smaller than the second angle θ2, and occurrence of the SDE can be reliably reduced.

The first angle θ1 simply needs to be smaller than the second angle θ2 and may be defined as an angle other than the angle at which at least three sub-pixels S continuously arrayed along the third array direction D3 overlap the second imaginary line L2 (e.g., an angle at which only two sub-pixels S continuously arrayed along the third array direction D3 overlap the second imaginary line L2).

In other words, the first display device 5*a* is disposed in the body 2*a* of the wearable part 2 with the first display region DAa oriented such that the first angle θ1 is smaller than the second angle θ2. The first display device 5*a* illustrated in FIG. 3 is disposed in the wearable part 2 with the first display region DAa oriented such that the first angle θ1 is 0 (the third array direction D3 and the Y1-direction are parallel) as illustrated in FIG. 11. In this case, the X2-direction is inclined with respect to the X1-direction, and the Y2-direction is inclined with respect to the Y1-direction.

An image displayed in the first display region DAa is displayed such that the left-and-right direction and the up-and-down direction of the image correspond to the X1-direction and the Y1-direction of the body 2*a* of the wearable part 2. In other words, the left-and-right direction and the up-and-down direction of the image displayed in the first display region DAa are inclined with respect to the X2-direction (first array direction D1) and the Y2-direction (second array direction D2) of the first display device 5*a*.

As described above, the first angle θ1 is smaller than the second angle θ2. In other words, the third array direction D3 illustrated in FIGS. 10, 11, and 12 forms a smaller angle (first angle θ1) with the Y1-direction of the wearable part 2 than the third array direction D3 illustrated in FIG. 8; and the fifth array direction D5 illustrated in FIGS. 10, 11, and 12 forms a smaller angle with the X1-direction of the wearable part 2 than the fifth array direction D5 illustrated in FIG. 8.

Therefore, if the first angle θ1 is smaller than the second angle θ2 as in the first display region DAa illustrated in FIGS. 10, 11, and 12, occurrence of a phenomenon in which the user visually recognizes the outline of objects included in the image displayed in the first display region DAa as a zigzag shape (what is called "jaggies") can be reduced as compared with the case where the first angle θ1 is equal to the second angle θ2 as in the display region illustrated in FIG. 8.

In the same manner as the first display device 5*a* described above, the second display device 5*b* can also reduce occurrence of the SDE by the orientation of the second display region DAb.

Specifically, in the second display region DAb illustrated in FIG. 9, a third distance H3 along the X1-direction between two third imaginary lines L3 adjacent to each other becomes smaller by decreasing a third angle θ3 between the Y1-direction (second imaginary line L2) and the fourth array direction D4 (third imaginary line L3), whereby occurrence of the SDE can be reduced.

In the second display region DAb, the distance between two third imaginary lines L3 adjacent to each other is referred to as a fourth distance H4. The fourth distance H4 corresponds to the distance between two sub-pixels S of the same color adjacent to each other in a sixth array direction D6 orthogonal to the fourth array direction D4.

In FIG. 9, a fourth angle θ4 between the second array direction D2 and the fourth array direction D4 is equal to the third angle θ3. When the second display region DAb rotates, around the Z2-direction, in the direction that reduces the third angle θ3 (the second display region DAb rotates in the counterclockwise direction in FIG. 9), the first array direction D1, the second array direction D2, the fourth array direction D4, and the sixth array direction D6 also rotate, and the fourth angle θ4 between the second array direction D2 and the fourth array direction D4 does not change.

In other words, rotating the second display region DAb around the Z2-direction in the direction that reduces the third angle θ3 (rotating the second display region DAb in the counterclockwise direction in FIG. 9) is equivalent to making the third angle θ3 smaller than the fourth angle θ4. Therefore, the second display device 5*b* is placed in the wearable part 2 with the second display region DAb oriented such that the third angle θ3 is smaller than the fourth angle θ4, whereby occurrence of the SDE can be reduced.

In other words, the second display device 5*b* is disposed in the body 2*a* of the wearable part 2 with the second display region DAb oriented such that the third angle θ3 is smaller than the fourth angle θ4. The second display device 5*b* illustrated in FIG. 3 is disposed in the wearable part 2 with the second display region DAb oriented such that the third angle θ3 is 0 (the fourth array direction D4 and the Y1-direction are parallel). In this case, the X2-direction is inclined with respect to the X1-direction, and the Y2-direction is inclined with respect to the Y1-direction.

The third angle θ3 may be defined as an angle at which at least three sub-pixels S out of the sub-pixels S continuously arrayed along the fourth array direction D4 overlap the second imaginary line L2. In this case, the third angle θ3 is certainly smaller than the fourth angle θ4, and occurrence of the SDE can be reliably reduced.

While the exemplary embodiment of the present disclosure has been described, the embodiment is not intended to limit the present disclosure. The contents disclosed in the embodiment are given by way of example only, and various modifications may be made without departing from the spirit of the present disclosure. Appropriate modifications made without departing from the spirit of the present disclosure naturally fall within the technical scope of the present disclosure.

For example, the first display region DAa of the first display device 5*a* may face the user's right eye and display an image for the right eye. In the second display device 5*b*, the second display region DAb of the second display device 5*b* may face the user's left eye and display an image for the left eye.

The display system 1 may include the first display device 5*a* instead of the second display device 5*b*. The display system 1 may include the second display device 5*b* instead of the first display device 5*a*.

The display panel 10 described above may be a vertical electric field liquid crystal display in which the common electrodes CE are disposed on the second substrate 14 to face the sub-pixel electrodes PE. Alternatively, the display panel 10 may be a reflective liquid crystal display.

Figure 13:
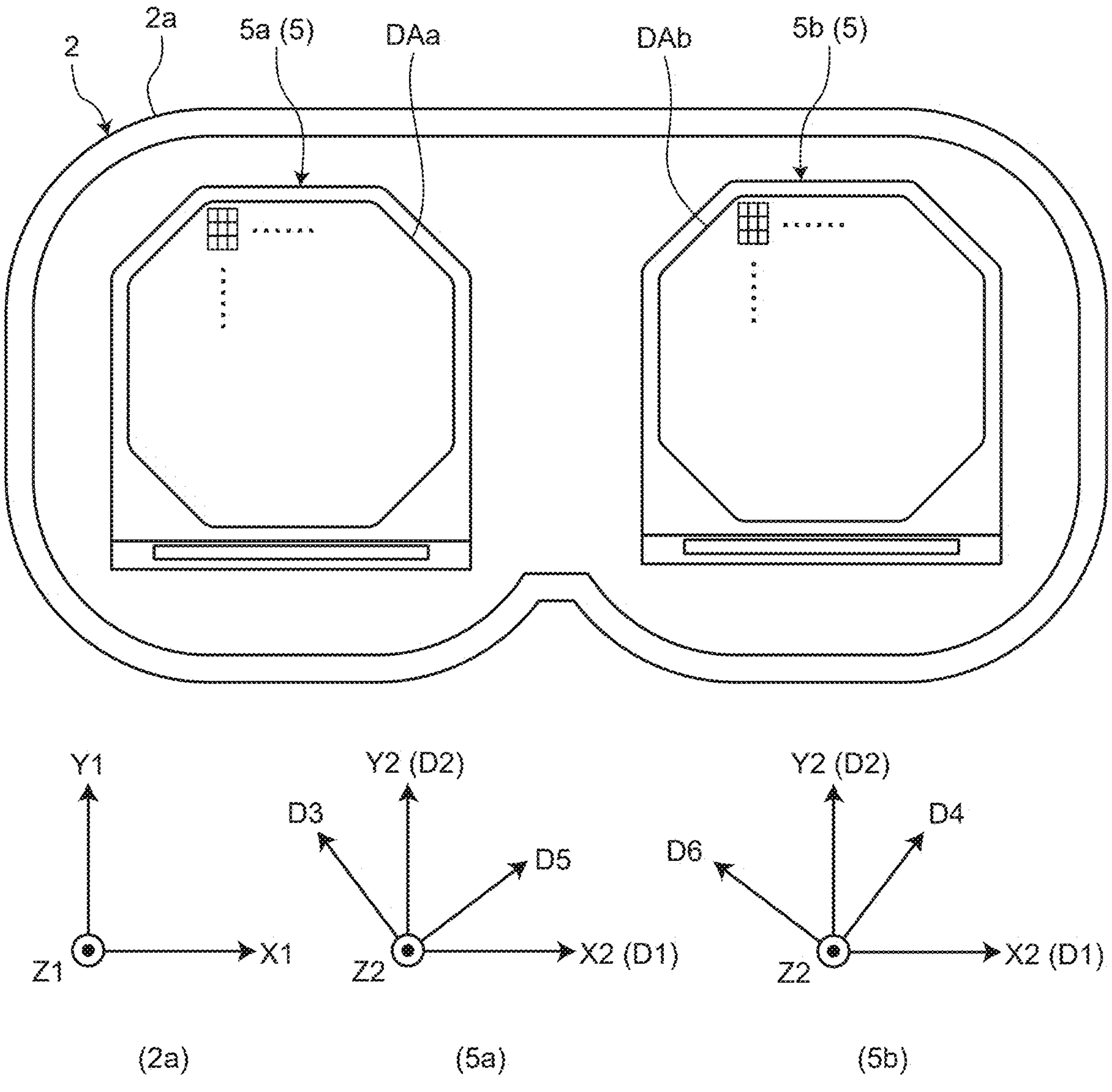
FIG. 13 is a schematic diagram of an arrangement of the display device in the wearable part according to a modification of the embodiment of the present disclosure.

FIG. 13 is a schematic diagram of an arrangement of the display device 5 in the wearable part 2 according to a modification of the embodiment of the present disclosure.

In the present modification, the first display device 5*a* is disposed in the body 2*a* of the wearable part 2 with the first display region DAa oriented such that the second array direction D2 and the Y1-direction are parallel as illustrated in FIG. 8. In this case, the X2-direction is parallel to the X1-direction, and the Y2-direction is parallel to the Y1-direction.

The second display device 5*b* is disposed in the body 2*a* of the wearable part 2 with the second display region DAb oriented such that the second array direction D2 and the Y1-direction are parallel as illustrated in FIG. 9. In this case, the X2-direction is parallel to the X1-direction, and the Y2-direction is parallel to the Y1-direction.

The first array direction D1 is an example of a "first direction". The second array direction D2 is an example of a "second direction". The third array direction D3 is an example of a "third direction". The X1-direction is an example of a "fourth direction". The Y1-direction is an example of a "fifth direction". The fourth array direction D4 is an example of a "sixth direction". The second imaginary line L2 is an example of an "imaginary line".

Out of other advantageous effects achieved by the aspects described in the present embodiment, advantageous effects clearly defined by the description in the present specification or appropriately conceivable by those skilled in the art are naturally achieved by the present disclosure.

What is claimed is:

1. A display system comprising:

a wearable part capable of being worn on a head of a user in a manner covering both eyes of the user;

a first display device provided to the wearable part and having a first display region facing one of the eyes of the user;

a second display device provided to the wearable part and having a second display region facing the other of the eyes of the user; and a drive circuit configured to display an image in each of the first display region and the second display region, wherein the first display region and the second display region are provided with a plurality of sub-pixels arrayed in a matrix having row-column configuration along a first direction and a second direction orthogonal to each other in plan view, the sub-pixels include a plurality of first sub-pixels, a plurality of second sub-pixels, and a plurality of third sub-pixels that have different colors, in the first display region, the first sub-pixels, the second sub-pixels, and the third sub-pixels are disposed such that: the first sub-pixel, the second sub-pixel, and the third sub-pixel are repeatedly arrayed along the first direction in the order as listed; and the first sub-pixel, the second sub-pixel, and the third sub-pixel are repeatedly arrayed along the second direction in the order as listed, the first sub-pixels are continuously arrayed in a third direction inclined with respect to the first direction and the second direction, the second sub-pixels are continuously arrayed in the third direction, and the third sub-pixels are continuously arrayed in the third direction, a first angle between a fifth direction and the third direction is smaller than a second angle between the second direction and the third direction in plan view, and the fifth direction is orthogonal to a fourth direction in which the first display region and the second display region are arranged.

2. The display system according to claim 1, wherein the first angle is defined as an angle at which at least three sub-pixels out of the sub-pixels continuously arrayed along the third direction overlap an imaginary line extending along the fifth direction.

3. The display system according to claim 1, wherein in the second display region, the first sub-pixels, the second sub-pixels, and the third sub-pixels are disposed such that: the first sub-pixel, the second sub-pixel, and the third sub-pixel are repeatedly arrayed along the first direction in the order as listed; and the first sub-pixel, the third sub-pixel, and the second sub-pixel are repeatedly arrayed along the second direction in the order as listed, the first sub-pixels are continuously arrayed in a sixth direction inclined with respect to the first direction and the second direction and different from the third direction, the second sub-pixels are continuously arrayed in the sixth direction, and the third sub-pixels are continuously arrayed in the sixth direction, and a third angle between the fifth direction and the sixth direction is smaller than a fourth angle between the second direction and the sixth direction in plan view.

4. The display system according to claim 1, wherein in plan view, the ratio of a second pitch to a first pitch is 4/3 or larger and smaller than 3, the second pitch is a pitch of two sub-pixels adjacent to each other in the second direction out of the sub-pixels, and the first pitch is a pitch of two sub-pixels adjacent to each other in the first direction out of the sub-pixels.

5. The display system according to claim 1, wherein each first sub-pixel is a red sub-pixel, each second sub-pixel is a green sub-pixel, and each third sub-pixel is a blue sub-pixel.

* * * * *